(12) United States Patent
Chang et al.

(10) Patent No.: US 11,700,003 B2
(45) Date of Patent: Jul. 11, 2023

(54) MICROCONTROLLER, OPERATION SYSTEM AND CONTROL METHOD THEREOF

(71) Applicant: Nuvoton Technology Corporation, Hsinchu Science Park (TW)

(72) Inventors: Tu-Yiin Chang, Hsinchu Science Park (TW); Te-Tsoung Tsai, Jhudong Township (TW)

(73) Assignee: NUVOTON TECHNOLOGY CORPORATION

( * ) Notice: Subject to any disclaimer, the term of this patent is extended or adjusted under 35 U.S.C. 154(b) by 0 days.

(21) Appl. No.: 17/708,689

(22) Filed: Mar. 30, 2022

(65) Prior Publication Data

US 2022/0352895 A1 Nov. 3, 2022

(30) Foreign Application Priority Data

Apr. 29, 2021 (TW) .................................. 110115512

(51) Int. Cl.
| | |
|---|---|
| *H03K 21/00* | (2006.01) |
| *H03K 21/38* | (2006.01) |
| *H03K 21/10* | (2006.01) |
| *H03K 3/286* | (2006.01) |

(52) U.S. Cl.
CPC ............. *H03K 21/38* (2013.01); *H03K 21/10* (2013.01); *H03K 3/2865* (2013.01)

(58) Field of Classification Search
CPC ....... H03K 21/38; H03K 21/10; H03K 3/2865
See application file for complete search history.

(56) References Cited

U.S. PATENT DOCUMENTS 11,393,870 B2 * 7/2022 Inui ........................ H04N 5/357

* cited by examiner

*Primary Examiner* — Tuan T Lam
(74) *Attorney, Agent, or Firm* — Muncy, Geissler, Olds & Lowe, P.C.

(57) ABSTRACT

A microcontroller is coupled to a detection circuit which generates a detection signal. The microcontroller includes a processing circuit and an input-output circuit. The processing circuit generates an output signal according to the detection signal. In response to the output signal being at a specific level, the processing circuit enables a reset signal. The input-output circuit includes a latch circuit and a counter circuit. The latch circuit latches the output signal to generate a latched signal. The counter circuit starts adjusting the count value in response to the reset signal being enabled. The counter circuit changes the level of the latched signal in response to the count value being equal to a predetermined value.

19 Claims, 4 Drawing Sheets

MICROCONTROLLER, OPERATION SYSTEM AND CONTROL METHOD THEREOF

CROSS REFERENCE TO RELATED APPLICATIONS

This Application claims priority of Taiwan Patent Application No. 110115512, filed on Apr. 29, 2021, the entirety of which is incorporated by reference herein.

BACKGROUND OF THE INVENTION

Field of the Invention

The invention relates to a microcontroller, and more particularly to a microcontroller having a programmable time recovery function.

Description of the Related Art

With technological development, the types and functions of electronic devices have increased. Many electronic elements are generally disposed in electronic devices. More electronic elements can operate in an operation mode or in a power-down mode. In the operation mode, the electronic elements operate normally. However, when a corresponding electronic element enters the power-down mode, the electronic element stops operating. At this time, the output signal generated by the electronic element may be fixed at a specific level. When the level of the output signal of the electronic element is fixed for a long time, the following circuits cannot operate normally.

BRIEF SUMMARY OF THE INVENTION

In accordance with an embodiment of the disclosure, a microcontroller is coupled to a detection circuit which generates a detection signal. The microcontroller comprises a processing circuit and an input-output circuit. The processing circuit generates an output signal according to the detection signal. In response to the output signal being at a specific level, the processing circuit enables a reset signal. The input-output circuit comprises a latch circuit and a counter circuit. The latch circuit latches the output signal to generate a latched signal. The counter circuit starts adjusting the count value in response to the reset signal being enabled. The counter circuit changes the level of the latched signal in response to the count value being equal to a predetermined value.

In accordance with another embodiment of the disclosure, an operation system comprises a detection circuit, a microcontroller, a first induction winding, a diode, a second induction winding, and a read circuit. The detection circuit is configured to generate a detection signal. The microcontroller comprises a processing circuit and an input-output circuit. The processing circuit generates an output signal according to the detection signal. In response to the output signal being at a specific level, the processing circuit enables a reset signal. The input-output circuit comprises a latch circuit and a counter circuit. The latch circuit latches the output signal to generate a latched signal. The counter circuit starts adjusting the count value in response to the reset signal being enabled. The counter circuit changes the level of the latched signal in response to the count value being equal to a predetermined value. The first induction winding detects an external signal and loads the latched signal into the external signal to generate a loaded signal. The diode is coupled between the input-output circuit and the first induction winding. The second induction winding is configured to output the external signal and receive the loaded signal. The read circuit generates the external signal and operates according to the loaded signal.

In accordance with a further embodiment of the disclosure, a control method for an input-output circuit which comprises a latch circuit latching an output signal to generate a latched signal and a counter circuit, comprises setting a predetermined value stored in the counter circuit; performing a count operation to adjust a count value; determining whether the count value is higher than the predetermined value; in response to determining that the count value is not higher than the predetermined value, disabling an overflow signal, and in response to determining that the count value is higher than the predetermined value, enabling the overflow signal to change the level of the latched signal.

Control methods of input-output circuit may be practiced by the systems which have hardware or firmware capable of performing particular functions and may take the form of program code embodied in a tangible media. When the program code is loaded into and executed by an electronic device, a processor, a computer or a machine, the electronic device, the processor, the computer or the machine becomes an input-output circuit for practicing the disclosed method.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
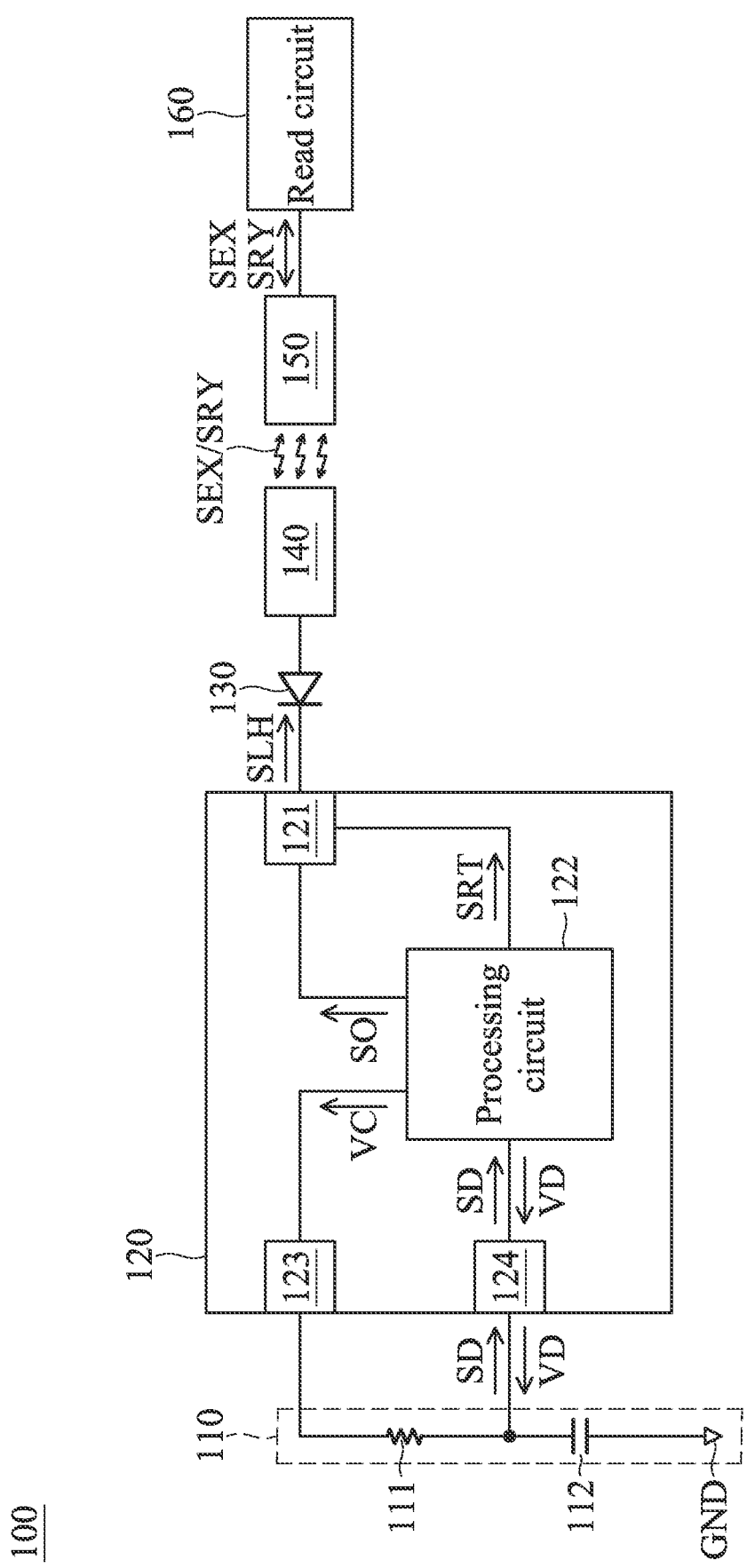
FIG. 1 is a schematic diagram of an exemplary embodiment of an operation system according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of an operation system according to various aspects of the present disclosure. The operation system 100 comprises a detection circuit 110, a microcontroller 120, a diode 130, induction windings 140 and 150, and a read circuit 160. The detection circuit 110 is configured to generate a detection signal SD. In one embodiment, the detection circuit 110 comprises a sensor to detect changes in a specific state, such as the changes in a temperature state, a sound state, a light state, or a pressure state. The structure of detection circuit 110 is not limited in the present disclosure. In this embodiment, the detection circuit 110 comprises a resistor 111 and a capacitive sensor 112. The resistor 111 and the capacitive sensor 112 are serially connected between the microcontroller 120 and a ground terminal GND. When the physical phenomenon of the external environment changes, the capacitance of the capacitive sensor 112 also changes accordingly. In one embodiment, the capacitive sensor 112 is a piezoelectric sensor.

The microcontroller 120 comprises an input-output circuit 121 and a processing circuit 122. The processing circuit 122 generates an output signal SO according to the detection signal SD. In this embodiment, when the output signal SO is at a specific level (e.g., a high level or a low level), the processing circuit 122 enables a reset signal SRT. After enabling the reset signal SRT, the processing circuit 122 may exit an operation mode and enter a power-down mode. In the power-down mode, the processing circuit 122 is idle. Therefore, the processing circuit 122 stops providing the output signal SO. In other embodiments, when the processing circuit 122 receives a wake-up signal (not shown), the processing circuit 122 exits the power-down mode and then enters the operation mode. In the operation mode, the processing circuit 122 re-generates the output signal SO according to the detection signal SD. The structure of processing circuit 122 is not limited in the present disclosure. In one embodiment, the processing circuit 122 is a central processing unit (CPU).

The input-output circuit 121 latches the output signal SO to generate a latched signal SLH. In this embodiment, when the reset signal SRT is enabled, the input-output circuit 121 performs a count operation. When the duration for which the input-output circuit 121 performs the count operation reaches predetermined time, the input-output circuit 121 changes the level of the latched signal SLH. In one embodiment, the predetermined time is set by the capacitive sensor 112.

In this embodiment, each when the processing circuit 122 generates the output signal SO, the processing circuit 122 enters a power-down mode. In the power-down mode, the processing circuit 122 is idle. At this time, since the output signal SO is stored in the input-output circuit 121, even if the processing circuit 122 is idle, the input-output circuit 121 is capable of maintaining the level of the latched signal SLH. However, if the latched signal SLH is maintained at a specific level for a long time, the following circuits may malfunction. Therefore, before entering the power-down mode, the processing circuit 122 determines whether the output signal SO is at a specific level (e.g., a high level or a low level). When the level of the output signal SO is equal to the specific level, the processing circuit 122 enables the reset signal SRT. The input-output circuit 121 performs a count operation. When finishing the count operation, the input-output circuit 121 changes the level of the latched signal SLH.

For example, assume that the specific level is a low level. In this case, after outputting the output signal SO which is at the low level, the processing circuit 122 enables the reset signal SRT and enters the power-down mode. At this time, the input-output circuit 121 performs the count operation. When finishing the count operation, the input-output circuit 121 changes the level of the latched signal SLH. Therefore, the latched signal SLH is not maintained at the low level for a long time. In this case, when outputting the output signal SO which is at a high level, the processing circuit 122 enters the power-down mode. The processing circuit 122 disables the reset signal SRT. Therefore, the input-output circuit 121 stops performing the count operation.

In other embodiment, the processing circuit 122 does not determine whether the level of the output signal SO is equal to a specific level. In such cases, no matter the level of the output signal SO is equal to a high level or a low level, each when the processing circuit 122 generates an output signal SO, the processing circuit 122 immediately enables the reset signal SRT and enters the power-down mode. When the reset signal SRT is enabled, the input-output circuit 121 performs a count operation. When the duration for which the input-output circuit 121 performs the count operation reaches predetermined time, the input-output circuit 121 changes the level of the latched signal SLH. Therefore, the latched signal SLH is not maintained at the high level or the level for a long time.

In other embodiments, the microcontroller 120 further comprises an input-output circuit 123. In this embodiment, the processing circuit 122 provides a charge voltage VC to the input-output circuit 123. The input-output circuit 123 outputs the charge voltage VC to the detection circuit 110 to charge the capacitive sensor 112. The processing circuit 122 determines the amount of change in a specific state according to the change in the voltage (i.e., the detection signal SD) of the capacitive sensor 112.

In some embodiments, the microcontroller 120 further comprises an input-output circuit 124. The input-output circuit 124 is coupled to the detection circuit 110 to receive the detection signal SD. The input-output circuit 124 provides the detection signal SD to the processing circuit 122. The processing circuit 122 determines the amount of change in a specific state of external environment according to the detection signal SD. In other embodiments, the processing circuit 122 provides a discharge voltage VD to the input-output circuit 124. The input-output circuit 124 outputs the discharge voltage VD to the detection circuit 110 to release the voltage of the capacitive sensor 112.

In other embodiments, the microcontroller 120 further comprises a bus (not shown). The bus is coupled between the processing circuit 122 and input-output circuits 121, 123, and 124. In this case, the processing circuit 122 transmits signals or voltages to the input-output circuits 121, 123, and 124 via the bus or receives signals or voltages from the input-output circuits 121, 123, and 124 via the bus. In some embodiments, the bus comprises many transmission paths (not shown). Each transmission path is coupled between one of the input-output circuits 121, 123, and 124 and the processing circuit 122.

The diode 130 is coupled between the input-output circuit 121 and the induction winding 140. The cathode of the diode 130 is coupled to the input-output circuit 121. The anode of the diode 130 is coupled to the induction winding 140. The type of diode 130 is not limited in the present disclosure. In one embodiment, the diode 130 is a Zener diode.

The induction winding 140 detects an external signal SEX and loads the latched signal SLH to the external signal SEX to generate a loaded signal SRY. In one embodiment, the induction winding 140 adjusts the amplitudes of the external signal SEX according to the latched signal SLH and serves the adjusted external signal SEX as the loaded signal SRY. In addition, the induction winding 150 outputs the external signal SEX and receives the loaded signal SRY. In one embodiment, the induction windings 140 and 150 are antennas.

The read circuit 160 generates the external signal SEX and utilizes the induction winding 150 to output the external signal SEX. In this embodiment, the read circuit 160 also utilizes the induction winding 150 to receive the loaded signal SRY. In such case, the read circuit 160 operates according to the loaded signal SRY. The read circuit 160 may decode the loaded signal SRY to obtain the amount of change in a specific state. Then, the read circuit 160 performs a corresponding operation according to the amount of change in the specific state. For example, the read circuit 160 may adjust sound of a speaker, display an image or adjust the brightness of a light source.

In some embodiments, the detection circuit 110, the microcontroller 120, the diode 130, and the induction winding 140 are integrated into a peripheral input device, such as a mouse or a touch panel. To determine the change in the specific state, the microcontroller 120 decodes the detection signal SD to generate the output signal SO. Therefore, the microcontroller 120 causes a lot of power consumption. To reduce the power consumption, the microcontroller 120 immediately enters a power-down mode after generating the output signal SO. In the power-down mode, the microcontroller 120 is idle. When the microcontroller 120 receives a wake-up signal, the microcontroller 120 exits the power-down mode and enters the operation mode. In the operation mode, the microcontroller 120 decodes the detection signal SD to generate a new output signal SO. After generating the new output signal SO, the microcontroller 120 re-enters the power-down mode.

Figure 2:
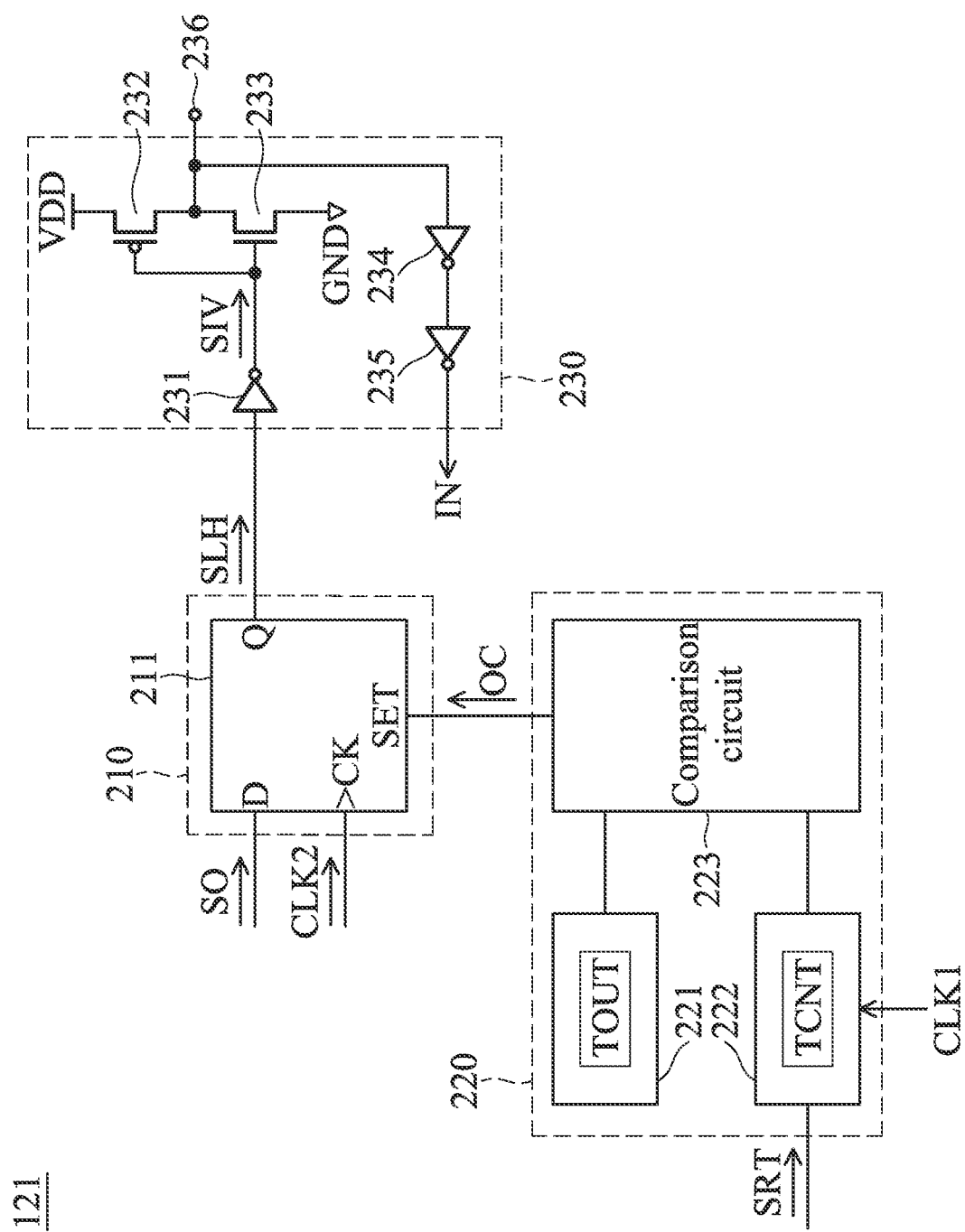
FIG. 2 is a schematic diagram of an exemplary embodiment of an input-output circuit according to various aspects of the present disclosure.

FIG. 2 is a schematic diagram of an exemplary embodiment of the input-output circuit 121 according to various aspects of the present disclosure. The input-output circuit 121 comprises a latch circuit 210 and a counter circuit 220. The latch circuit 210 latches the output signal SO to generate the latched signal SLH. In this embodiment, the latch circuit 210 comprises a D flip-flop 211. The D flip-flop 211 comprises an input terminal D, a clock terminal CK, an output terminal Q, and a set terminal SET. The input terminal D receives the output signal SO. The clock terminal CK receives a clock signal CLK2. The output terminal Q outputs the latched signal SLH. The set terminal SET receives an overflow signal OC.

The source providing the clock signal CLK2 is not limited in the present disclosure. In one embodiment, the clock signal CLK2 is provided by the processing circuit 122. In such cases, when the processing circuit 122 operates in an operation mode, the processing circuit 122 provides the clock signal CLK2 to the D flip-flop 211. Therefore, the D flip-flop 211 reads the output signal SO according to the clock signal CLK2. For example, each when the clock signal CLK2 is changed from a first level to a second level, the D flip-flop 211 is triggered. Therefore, the D flip-flop 211 reads the output signal SO and serves the read signal as the latched signal SLH. However, when the processing circuit 122 operates in a power-down mode, the processing circuit 122 stops providing the clock signal CLK2 to the D flip-flop 211. At this time, the D flip-flop 211 maintains the level of the latched signal SLH. The latched signal SLH may be maintained at a high level or a low level.

In other embodiments, the clock signal CLK2 is provided by a clock generator circuit (not shown). In this case, when the processing circuit 122 enters an operation mode, the processing circuit 122 activates the clock generator circuit, therefore, the clock generator circuit generates the clock signal CLK2. However, when the processing circuit 122 enters a power-down mode, the processing circuit 122 de-activates the clock generator circuit. Therefore, the clock generator circuit stops providing the clock signal CLK2. In some embodiments, the clock generator circuit may be combined into the input-output circuit 121 or a separate circuit from the input-output circuit 121.

The counter circuit 220 is coupled to the latch circuit 210 and receives the reset signal SRT. When the reset signal SRT is enabled, the counter circuit 220 performs a count operation. In one embodiment, the counter circuit 220 accumulates the number of pulses of a clock signal CLK1 to generate an accumulation result and then adjusts a count value TCNT according to the accumulation result. In this case, when the processing circuit 122 enters the operation mode or the power-down mode, the frequency of the clock signal CLK1 is fixed. Therefore, even if the processing circuit 122 enters the power-down mode, the counter circuit 220 is capable of operating normally. Additionally, when the processing circuit 122 enters the operation mode, the frequency of the clock signal CLK1 is lower than the frequency of the clock signal CLK2. However, when the processing circuit 122 enters the power-down mode, the frequency of the clock signal CLK1 is higher than the frequency of the clock signal CLK2.

When the count value TCNT is equal to a predetermined value TOUT, it means that the duration for which the counter circuit 220 performs the count operation reaches predetermined time. The invention does not limit how the counter circuit 220 changes the level of the latched signal SLH. In this embodiment, when the count value TCNT is equal to a predetermined value TOUT, the counter circuit 220 enables the overflow signal OC. Since the set terminal of the D flip-flop 211 receives the overflow signal OC, when the overflow signal OC is enabled, the D flip-flop 211 changes the level of the latched signal SLH. At this time, the level of the latched signal SLH may be changed from a low level to a high level. In other embodiments, the overflow signal OC is provided to a clear terminal (not shown) of the D flip-flop 211. In this case, when the overflow signal OC is enabled, the D flip-flop 211 changes the level of the latched signal SLH. At this time, the level of the latched signal SLH may be changed from a high level to a low level.

In this embodiment, to reduce the power consumption of the processing circuit 122, after generating the output signal SO, the processing circuit 122 enters a power-down mode. At this time, since the processing circuit 122 does not provide the clock signal CLK2, the level of the latched signal SLH is maintained. However, when the level of the latched signal SLH is not changed for a long time, the operations of the following circuits may be affected by the latched signal SLH. Therefore, the processing circuit 122 determines whether the level of the output signal SO is equal to a specific level before entering the power-down mode. If the level of the output signal SO is equal to the specific level, the processing circuit 122 enables the reset signal SRT. After enabling the reset signal SRT, the processing circuit 122 enters the power-down mode. At this time, since the reset signal SRT is enables, the counter circuit 220 starts adjusting the count value TCNT. When the count value TCNT is equal to the predetermined value TOUT, the counter circuit 220 changes the level of the latched signal SLH, such as from a low level to a high level or from a high level to a low level.

The structure of counter circuit 220 is not limited in the present disclosure. In this embodiment, the counter circuit 220 comprises a register 221, a counter 222 and a comparison circuit 223. The register 221 is configured to store the predetermined value TOUT. In one embodiment, the processing circuit 122 writes the predetermined value TOUT to the register 221.

The counter 222 accumulates the number of pulses of the clock signal CLK1 to generate an accumulation result and serves the accumulation result as the count value TCNT. In this embodiment, when the reset signal SRT is enabled, the counter 222 resets the count value TCNT so that the count value TCNT is equal to an initial value, such as 0. Then, the counter 222 adjusts the count value TCNT according to the number of pulses of the clock signal CLK1.

The comparison circuit 223 compares the count value TCNT with the predetermined value TOUT. When the count value TCNT is greater than the predetermined value TOUT, the comparison circuit 223 enables the overflow signal OC. At this time, the overflow signal OC may be at a high level. However, when the count value TCNT is not greater than the predetermined value TOUT, the comparison circuit 223 does not enable the overflow signal OC. At this time, the overflow signal OC may be at a low level.

In other embodiments, the input-output circuit 121 further comprises a buffer circuit 230. The buffer circuit 230 comprises inverters 231, 234, and 235, a P-type transistor 232 and a N-type transistor 233. The inverter 231 inverts the latched signal SLH to generate an inverted signal SIV. When the latched signal SLH is at a low level, the inverted signal SIV is at a high level. Therefore, the N-type transistor 233 is turned on. At this time, the voltage of a pin 236 is equal to the voltage of the ground terminal GND, such as 0V. However, when the level of the latched signal SLH is a high level, the level of the inverted signal SIV is a low level. Therefore, the P-type transistor 232 is turned on. At this time, the voltage of the pin 236 is equal to an operation voltage VDD.

The input of the inverter 234 is coupled to the pin 236. The output of the inverter 234 is coupled to the input of the inverter 235. The output of the inverter 235 provides an input signal IN. In one embodiment, the inverter 235 provides the input signal IN to the processing circuit 122. In this case, the processing circuit 122 processes the detection signal SD according to the input signal IN to generate the output signal SO.

In some embodiments, the buffer circuit 230 can be omitted. When the buffer circuit 230 is omitted, the output terminal Q of the D flip-flop 221 is directly connected to the cathode of the diode 130. When the input-output circuit 121 comprises the buffer circuit 230, the pin 236 is coupled to the cathode of the diode 130.

Figure 3:
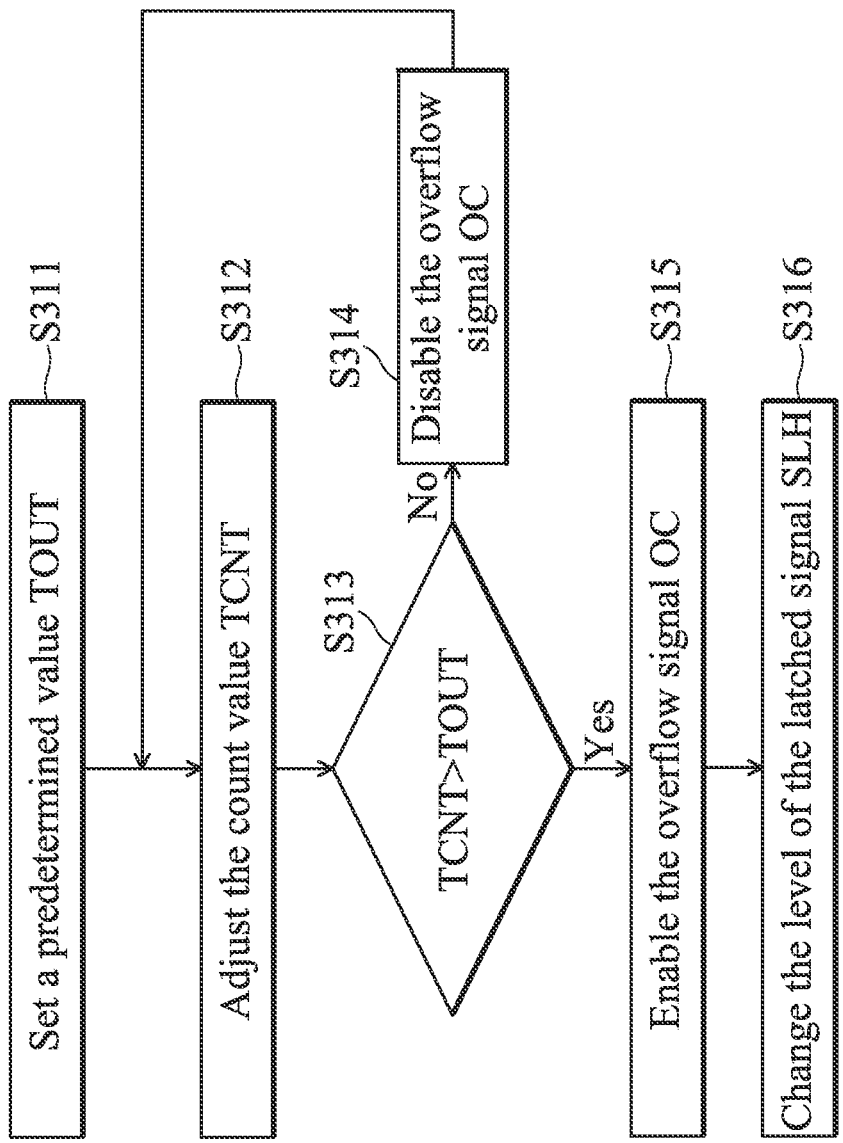
FIG. 3 is a control flowchart of an exemplary embodiment of the input-output circuit according to various aspects of the present disclosure.

FIG. 3 is a control flowchart of an exemplary embodiment of the input-output circuit 121 according to various aspects of the present disclosure. First, a predetermined value TOUT is set (step S311). In one embodiment, the predetermined value TOUT is provided by the processing circuit 122. In this case, the processing circuit 122 writes the predetermined value TOUT to the register 221.

Next, a count operation is performed to adjust the count value TCNT (step S312). In one embodiment, when the processing circuit 122 enables the reset signal SRT, the counter 222 starts to perform a count operation. In this case, each when the processing circuit 122 provides the output signal SO to the latch circuit 210, the processing circuit 122 determines whether to enable the reset signal SRT according to the output signal SO. When the level of the output signal SO is equal to a specific level, the processing circuit 122 enables the reset signal SRT. After enabling the reset signal SRT, the processing circuit 122 enters a power-down mode. However, when the level of the output signal SO is not equal to the specific level, the processing circuit 122 does not enable the reset signal SRT. At this time, the processing circuit 122 enters the power-down mode. In this case, since the processing circuit 122 does not enable the reset signal SRT, the counter 222 does not perform the count operation.

In other embodiments, the processing circuit 122 does not determine whether the level of the output signal SO is equal to the specific level. In this case, each when the processing circuit 122 provides the output signal SO to the latch circuit 210, the processing circuit 122 immediately enables the reset signal SRT to direct the counter 222 to perform the count operation.

Then, a determination is made as to whether the count value TCNT is greater than the predetermined value TOUT (step S313). When the count value TCNT is greater than the predetermined value TOUT, the comparison circuit 223 disables the overflow signal OC (step S314) and step S312 is performed to execute the count operation. However, when the count value TCNT is greater than the predetermined value TOUT, the comparison circuit 223 enables the overflow signal OC (step S315). Therefore, the level of the latched signal SLH is changed (step S316). In one embodiment, the level of the latched signal SLH may be changed from a low level to a high level or from a high level to a low level.

In some embodiments, when the processing circuit 122 enters an operation mode, the input-output circuit 121 performs step S311 to store the predetermined value TOUT. In the operation mode, the input-output circuit 121 latches the output signal SO generated by the processing circuit 122 and then outputs the latched signal SLH. At this time, the latched signal SLH is the same as the output signal SO.

When the processing circuit 122 exits the operation mode and enters the power-down mode, the input-output circuit 121 starts performing step S312. In the power-down mode, since the processing circuit 122 stops generating the output signal SO, the input-output circuit 121 maintains the level of the latched signal SLH according to the level of the last output signal SO which is provided by the processing circuit 122 before the processing circuit 122 enters the power-down mode. If the latched signal SLH is maintained at a specific level for a long time, the following circuits receiving the latched signal SLH may malfunction. Therefore, before entering the power-down mode, the processing circuit 122 enables the reset signal SRT to direct the input-output circuit 121 changes the level of the latched signal SLH after predetermine time.

Figure 4:
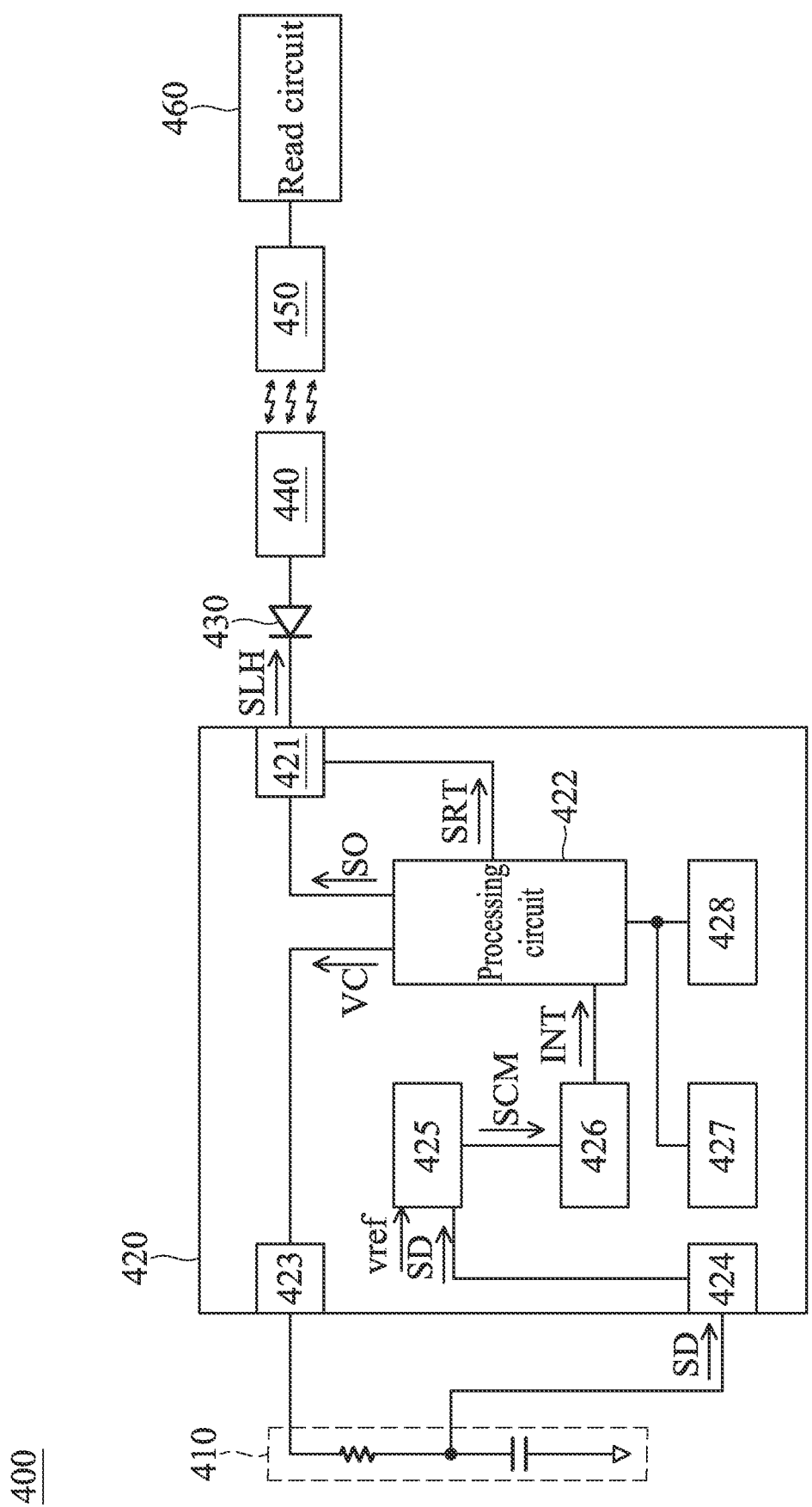
FIG. 4 is a schematic diagram of another exemplary embodiment of the operation system according to various aspects of the present disclosure.

FIG. 4 is a schematic diagram of another exemplary embodiment of the operation system according to various aspects of the present disclosure. The operation system 400 comprises a detection circuit 410, a microcontroller 420, a diode 430, induction windings 440 and 450, and a read circuit 460. Since the characteristics of the detection circuit 410, the diode 430, the induction windings 440 and 450, and the read circuit 460 shown in FIG. 4 are similar to the characteristics of the detection circuit 110, the diode 130, the induction windings 140 and 150, and the read circuit 160 shown in FIG. 1, the related description is not repeated here.

The microcontroller 420 comprises input-output circuits 421, 423, and 424, a processing circuit 422, a comparison circuit 425, and a counter circuit 426. The input-output circuit 421 receives the output signal SO and the reset signal SRT. The input-output circuit 421 latches the output signal SO to generate the latched signal SLH. When the reset signal SRT is enabled, the input-output circuit 421 changes the level of the latched signal SLH. Since the characteristic of the input-output circuit 421 is similar to the characteristic of the input-output circuit 121 shown in FIG. 1, the related description is not repeated here.

The processing circuit 422 outputs the charge voltage VC to the detection circuit 410 via the input-output circuit 423. The input-output circuit 424 receives the detection signal SD and provides the detection signal SD to the comparison circuit 425. The comparison circuit 425 compares the detection signal SD with the reference signal vref to generate a comparison signal SCM. The structure of comparison circuit 425 is not limited in the present disclosure. In one embodiment, the comparison circuit 425 is an analog comparator (ACMP). The counter circuit 426 measures a time interval when the level of the comparison signal SCM reaches a predetermined level from an initial level to generate a counting result. After generating the counting result, the counter circuit 426 sends an interrupt signal INT. The processing circuit 422 reads and processes the counting result generated by the counter circuit 426 according to the interrupt signal INT to generate the output signal SO. In this case, the counting result generated by the counter circuit 426 associates with the detection signal SD which associates with the changes in physical quantities in the external environment. Therefore, the processing circuit 422 is capable of determining the physical quantities in the external environment according to the counting result generated by the counter circuit 426.

In other embodiments, the microcontroller 420 further comprises memories 427 and 428. The memory 427 is a non-volatile memory, such as a read only memory (ROM). The memory 428 is a volatile memory, such as a static random access memory (SRAM). The microcontroller 420 operates according to the program codes stored in the memories 427 and 428.

Control methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an input-output circuit for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes an input-output circuit for practicing the disclosed methods. When implemented on a general-purpose processor, the program code combines with the processor to provide a unique apparatus that operates analogously to application-specific logic circuits.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A microcontroller coupled to a detection circuit which generates a detection signal, comprising:
    a processing circuit generating an output signal according to the detection signal, wherein in response to the output signal being at a specific level, the processing circuit enables a reset signal; and
    an input-output circuit comprising:
    a latch circuit latching the output signal to generate a latched signal; and
    a first counter circuit starting to adjust a count value in response to the reset signal being enabled, wherein the first counter circuit changes a level of the latched signal in response to the count value being equal to a predetermined value.

2. The microcontroller as claimed in claim 1, wherein the detection circuit comprises a piezoelectric sensor.

3. The microcontroller as claimed in claim 1, wherein in response to the reset signal being enabled, the first counter circuit counts the number of pulses of a first clock signal to adjust the count value.

4. The microcontroller as claimed in claim 3, wherein the latch circuit comprises:
    a D flip-flop comprising an input terminal, a clock terminal, an output terminal, and a set terminal, wherein the input terminal receives the output signal, the clock terminal receives a second clock signal, the output terminal outputs the latched signal, and the set terminal receives an overflow signal.

5. The microcontroller as claimed in claim 4, wherein in response to the count value being equal to the predetermined value, the first counter circuit enables the overflow signal to change a level of the latched signal.

6. The microcontroller as claimed in claim 4, wherein:
    after enabling the reset signal, the processing circuit exits an operation mode and enters a power-down mode,
    in the operation mode, the processing circuit generates the output signal according to the detection signal, and
    in the power-down mode, the processing circuit stops generating the output signal.

7. The microcontroller as claimed in claim 6, wherein in the operation mode, the processing circuit provides the second clock signal, and in the power-down mode, the processing circuit stops providing the second clock signal.

8. The microcontroller as claimed in claim 1, wherein the first counter circuit comprises a register to store the predetermined value.

9. The microcontroller as claimed in claim 8, wherein the processing circuit writes the predetermined value to the register.

10. The microcontroller as claimed in claim 1, further comprising:
    a comparison circuit comparing the detection signal with a reference signal to generate a comparison signal; and
    a second counter circuit measuring a time interval when the level of the comparison signal reaches a predetermined level from an initial level to generate a counting result,
    wherein the processing circuit processes the counting result to generate the output signal.

11. An operation system comprising:
    a detection circuit configured to generate a detection signal;

a microcontroller comprising:
a processing circuit generating an output signal according to the detection signal, wherein in response to the output signal being at a specific level, the processing circuit enables a reset signal; and
an input-output circuit comprising:
- a latch circuit latching the output signal to generate a latched signal; and
- a first counter circuit starting to adjust a count value in response to the reset signal being enabled, wherein the first counter circuit changes a level of the latched signal in response to the count value being equal to a predetermined value;
- a first induction winding for detecting an external signal and loading the latched signal into the external signal to generate a loaded signal;
- a diode coupled between the input-output circuit and the first induction winding;
- a second induction winding configured to output the external signal and receive the loaded signal; and
- a read circuit generating the external signal and operating according to the loaded signal.

12. The operation system as claimed in claim 11, wherein the detection circuit comprises a piezoelectric sensor.

13. The operation system as claimed in claim 11, wherein in response to the reset signal being enabled, the first counter circuit counts the number of pulses of a first clock signal to adjust the count value.

14. The operation system as claimed in claim 13, wherein the latch circuit comprises:
- a D flip-flop comprising an input terminal, a clock terminal, an output terminal, and a set terminal, wherein the input terminal receives the output signal, the clock terminal receives a second clock signal, the output terminal outputs the latched signal, and the set terminal receives an overflow signal, wherein in response to the count value being equal to the predetermined value, the first counter circuit enables the overflow signal to change a level of the latched signal.

15. The operation system as claimed in claim 14, wherein:
after enabling the reset signal, the processing circuit exits an operation mode and enters a power-down mode,
in the operation mode, the processing circuit generates the output signal according to the detection signal, and
in the power-down mode, the processing circuit stops generating the output signal.

16. The operation system as claimed in claim 15, wherein in the operation mode, the processing circuit provides the second clock signal, and in the power-down mode, the processing circuit stops providing the second clock signal.

17. The operation system as claimed in claim 15, wherein:
in response to the processing circuit operating in the operation mode, a frequency of the second clock signal is higher than a frequency of the first clock signal, and
in response to the processing circuit operating in the power-down mode, the frequency of the second clock signal is lower than the frequency of the first clock signal.

18. The operation system as claimed in claim 11, further comprising:
- a comparison circuit comparing the detection signal with a reference signal to generate a comparison signal; and
- a second counter circuit measuring a time interval when the level of the comparison signal reaches a predetermined level from an initial level to generate a counting result, wherein the processing circuit processes the counting result to generate the output signal.

19. The operation system as claimed in claim 11, wherein a cathode of the diode receives the latched signal, and an anode of the diode is coupled to the first induction winding.

* * * * *